United States Patent
Helbing et al.

(10) Patent No.: US 11,152,545 B2
(45) Date of Patent: Oct. 19, 2021

(54) INERT FILLER TO INCREASE WAVELENGTH CONVERTING MATERIAL VOLUME AND IMPROVE COLOR OVER ANGLE

(71) Applicant: LUMILEDS LLC, San Jose, CA (US)

(72) Inventors: Rene Helbing, San Jose, CA (US); Daniel Estrada, San Jose, CA (US); Kentaro Shimizu, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 197 days.

(21) Appl. No.: 16/055,965

(22) Filed: Aug. 6, 2018

(65) Prior Publication Data
US 2020/0044120 A1 Feb. 6, 2020

(51) Int. Cl.
*H01L 33/50* (2010.01)
*H01L 33/00* (2010.01)
*H01L 33/44* (2010.01)

(52) U.S. Cl.
CPC .......... *H01L 33/502* (2013.01); *H01L 33/005* (2013.01); *H01L 33/44* (2013.01); *H01L 33/505* (2013.01)

(58) Field of Classification Search
CPC .......... H01L 2933/0041; H01L 33/005; H01L 33/44; H01L 33/501; H01L 33/502; H01L 33/505; H01L 33/00; H01L 33/50
See application file for complete search history.

(56) References Cited

U.S. PATENT DOCUMENTS

| 6,791,259 B1 * | 9/2004 | Stokes | C09K 11/7734 257/98 |
| 2004/0094757 A1 * | 5/2004 | Braune | C09K 11/025 257/13 |
| 2009/0184333 A1 * | 7/2009 | Wang | H01L 33/508 257/88 |

(Continued)

FOREIGN PATENT DOCUMENTS

| CN | 105874618 A | 8/2016 |
| EP | 1501909 A1 | 2/2005 |

(Continued)

OTHER PUBLICATIONS

European Search Report, EP Application No. 18201255, dated Mar. 22, 2019, 1 page.

(Continued)

*Primary Examiner* — Matthew C Landau
*Assistant Examiner* — Dmitriy Yemelyanov

(57) ABSTRACT

Devices and techniques are disclosed herein which include a die including side surfaces such that light emitted from the die can exit through the side surfaces. The die includes a first surface and a second surface opposite the first surface such that the distance between the first surface and the second surface is at least 100 micro meters. The die also include a wavelength converting material deposited external to the die such that the wavelength converting material covers the side surfaces. The wavelength converting material includes phosphor particles, a transparent risen carrier, and transparent particles configured to increase the volume of the wavelength converting material, the transparent particles having a refractive index (RI) that is similar to the RI of the transparent risen carrier.

20 Claims, 8 Drawing Sheets

(56) References Cited

U.S. PATENT DOCUMENTS

| | | | |
|---|---|---|---|
| 2009/0272996 A1* | 11/2009 | Chakraborty | H01L 33/56 257/98 |
| 2011/0069490 A1* | 3/2011 | Liu | H01L 33/501 362/259 |
| 2011/0140289 A1* | 6/2011 | Shiobara | C08K 3/34 257/789 |
| 2011/0195532 A1* | 8/2011 | Lerman | H01L 25/0753 438/27 |
| 2015/0034990 A1* | 2/2015 | Roitman | H01L 33/46 257/98 |
| 2016/0322540 A1* | 11/2016 | Moran | H01L 33/0095 |
| 2017/0365747 A1 | 12/2017 | Basin et al. | |
| 2018/0062052 A1* | 3/2018 | Bohmer | H01L 33/50 |
| 2018/0122993 A1 | 5/2018 | Camras et al. | |

FOREIGN PATENT DOCUMENTS

| | | |
|---|---|---|
| JP | 2018-148206 A | 9/2018 |
| WO | 03/093393 A1 | 11/2003 |

OTHER PUBLICATIONS

International Search Report corresponding to PCT/US2019/045148 dated Oct. 2, 2019, 5 pages.

Written Opinion of the International Searching Authority corresponding to PCT/US2019/045148 dated Oct. 2, 2019, 8 pages.

* cited by examiner

INERT FILLER TO INCREASE WAVELENGTH CONVERTING MATERIAL VOLUME AND IMPROVE COLOR OVER ANGLE

BACKGROUND

Light emitting diodes (LEDs), which include eight emitting elements (LEEs), are commonly used as light sources in various applications. LEDs can be more energy-efficient than traditional light sources, providing much higher energy conversion efficiency than incandescent lamps and fluorescent light, for example.

To improve light extraction efficiency, the use of taller dies has been implemented in LEDs. The taller dies can result in an improvement in light output as it may be easier for light to escape through the side of the die, when compared to a shorter die. The amount of surface area of the side surfaces of taller dies is greater in comparison to the surface area of the side surfaces of similar shorter dies. Accordingly, taller dies can enable more light to exit through their side surfaces in comparison to similar shorter dies.

SUMMARY

According to aspects of the disclosure, a device is disclosed which include a die including side surfaces such that light emitted from the die can exit through the side surfaces. The die includes a first surface and a second surface opposite the first surface such that the distance between the first surface and the second surface is at least 100 micro meters. The die also include a wavelength converting material deposited external to the die such that the wavelength converting material covers the side surfaces. The wavelength converting material includes phosphor particles, a transparent risen carrier, and transparent particles configured to increase the volume of the wavelength converting material, the transparent particles having a refractive index (RI) that is similar to the RI of the transparent risen carrier.

According to aspects of the disclosure, a method for producing a LED die is disclosed. The method includes manufacturing a wavelength converting material including phosphor particles, a transparent risen carrier, and transparent particles configured to increase the volume of the wavelength converting material, the transparent particles having a refractive index (RI) that is similar to the RI of the transparent risen carrier. The manufactured wavelength converting material may be deposited over an LED die that is at least 100 micro meters in height, such that the manufactured wavelength converting material covers the sides of the LED. The manufactured wavelength converting material may experience sedimentation such that the manufactured wavelength converting material covers the sides of the LED die after such sedimentation.

BRIEF DESCRIPTION OF THE DRAWINGS

The drawings described below are for illustration purposes only. The drawings are not intended to limit the scope of the present disclosure. Like reference characters shown in the figures designate the same parts in the various embodiments.

DETAILED DESCRIPTION

Figure 1A:
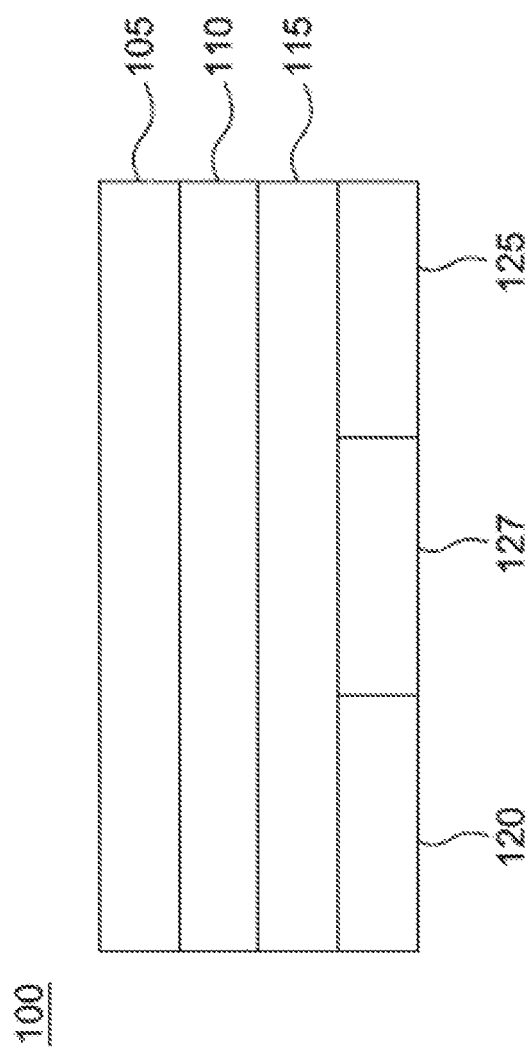
FIG. 1A is a diagram of an example light emitting element (LEE) that includes a light emitting semiconductor structure and a porous structure.

According to aspects of the disclosure, to improve light extraction efficiency, taller dies can be used in light emitting diodes (LEDs). The taller dies may result in improved light output due to the increased surface area made available at the sides of a die as a result of the die being taller. Notably, for example, a die that is 100 micro meters tall will have a smaller side surface area in comparison with a die that is, for example, 200 micro meters tall and approximately the same depth as the 100 micro meters tall die. A wavelength converting material is often deposited on LED dies in order to convert the light (e.g., blue light) emitted from the die to a different color (e.g., white). A wavelength converting material that may cover the top or first surface as well as the side surfaces of a shorter die (e.g., a 100 micro meter tall die). However, the same wavelength converting material may not cover at least the side surfaces of a taller die as it may not reach the height of the taller die. To clarify, the wavelength converting material may be deposited such that, when it settles or experiences sedimentation, the height of the material is not as tall as the height of a taller die. Accordingly, at least a portion of the light from the die may escape via the side surfaces of the die without traversing through the wavelength converting material.

All or a portion of the light from the die escaping without traversing the wavelength converting material may result in an undesirable increase in a deviation in color over angle (COA). To clarify, color can vary as a result of the angle by which it exits the LED based on, for example, whether it passes through a wavelength converting material. At certain angles the optical path of light exiting the die (e.g., blue light) may be larger, leading to more absorption, compared to a spectrum with less blue light and more phosphorconverted (yellow) light. Accordingly, an LED may emit different colors which are visible at different angles from the LED. Such differences in colors emitted over different angles are not desirable, especially in an LED being used to emit a single color.

As disclosed herein, inert fillers such as transparent particles such as silica may be mixed with the wavelength converting material and may cause the height of the wavelength converting material to increase, in comparison to the wavelength converting material without the transparent particles. The transparent particles, such as silica, may not affect the optical properties of the wavelength converting material such that the light properties of the light emitted via the wavelength converting material is similar to those of the light emitted from a wavelength converting material without the transparent particles. The increased volume or height of the wavelength converting material may allow the wavelength converting material to cover the sides of taller LEDs, thereby reducing the change in COA across the LED.

Examples of different light fixture will be described more fully hereinafter with reference to the accompanying drawings. These examples are not mutually exclusive, and features found in one example can be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

FIG. 1A is a diagram of an example light emitting element (LEE) 100 that includes a light emitting semiconductor structure 115, a wavelength converting material 110, and an optional coating 105 on the wavelength converting material 110. Contacts 120 and 125 may be coupled to the light emitting semiconductor structure 115, either directly or via another structure such as a submount, for electrical connection to a circuit board or other substrate or device. In embodiments, the contacts 120 and 125 may be electrically insulated from one another by a gap 127, which may be filled with a dielectric material. The light emitting semiconductor structure 115 may be any light emitting semiconductor structure that emits light that may be converted to light having a different color point via a wavelength converting material. For example, the light emitting semiconductor structure 115 may be formed from III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof. These example semiconductors have indices of refraction ranging from about 2.4 to about 4.1 at the typical emission wavelengths of LEDs in which they are present. For example, III-Nitride semiconductors, such as GaN, have refractive indices of about 2.4 at 500 nm, and III-Phosphide semiconductors, such as InGaP, have refractive indices of about 3.7 at 600 nm. Contacts 120 and 125 may be formed from a solder, such as AuSn, AuGa, AuSi or SAC solders.

Figure 1B:
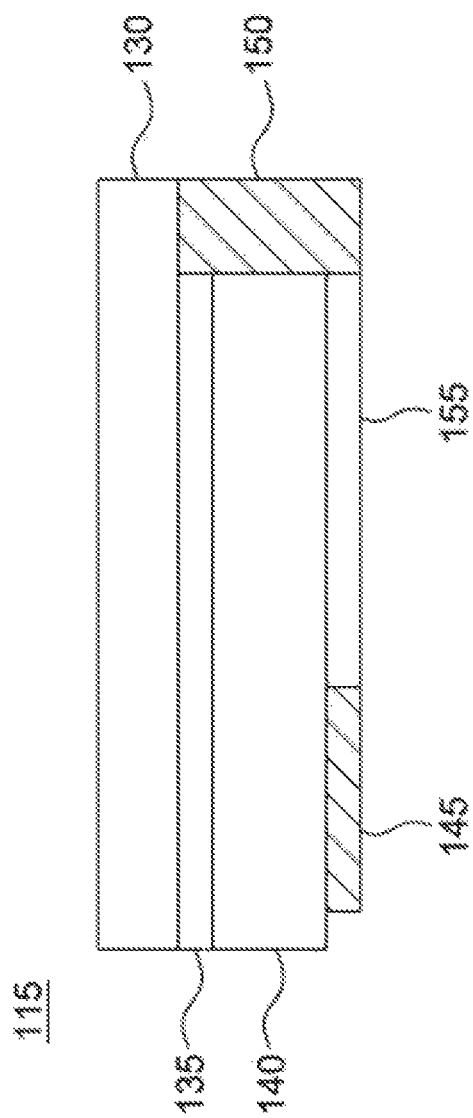
FIG. 1B is a diagram of an example light emitting semiconductor structure that may be included in the LEE of FIG. 1A.

FIG. 1B is a diagram of an example light emitting semiconductor structure 115 that may be included in the LEE 100 of FIG. 1A. The illustrated example is a flip chip structure. However, one of ordinary skill in the art will understand that the embodiments described herein may be applied to other types of LED designs, such as vertical, lateral, and multi junction devices.

In the example illustrated in FIG. 1B, the light emitting semiconductor structure 115 includes a light emitting active region 135 disposed between a semiconductor layer or semiconductor region of n-type conductivity (also referred to as an n-type region) 130 and a semiconductor layer or region of p-type conductivity (also referred to as a p-type region) 140. Contacts 145 and 150 are disposed in contact with a surface of the light emitting semiconductor structure 115 and electrically insulated from one another by a gap 155, which may be filled by a dielectric material, such as an oxide or nitride of silicon (i.e., SiO2 or Si3N4). In the illustrated embodiment, contact 145 (also referred to as a p-contact) is in direct contact with a surface of the p-type region 140, and the contact 150 (also referred to as an n-contact) is in direct contact with a surface of the n-type region 130. Although not shown in FIG. 1B, a dielectric material, such as disposed in the gap 155, may also line side walls of the light emitting active region 135 and p-type region 140 to electrically insulate those regions from the contact 150 to prevent shorting of the p-n junction.

The n-type region 130 may be grown on a growth substrate and may include one or more layers of semiconductor material. Such layer or layers may include different compositions and dopant concentrations including, for example, preparation layers, such as buffer or nucleation layers, and/or layers designed to facilitate removal of the growth substrate. These layers may be n-type or not intentionally doped, or may even be p-type device layers. The layers may be designed for particular optical, material, or electrical properties desirable for the light emitting region to efficiently emit light. Like the n-type region 130, the p-type region 140 may include multiple layers of different composition, thickness, and dopant concentrations, including layers that are not intentionally doped, or n-type layers. While layer 130 is described herein as the n-type region and layer 140 is described herein as the p-type region, the n-type and p-type regions could also be switched without departing from the scope of the embodiments described herein.

The light emitting active region 135 may be, for example, a p-n diode junction associated with the interface of p-region 140 and n-region 135. Alternatively, the light emitting active region 135 may include one or more semiconductor layers that are doped n-type or p-type or are un-doped. For example, the light emitting active region 135 may include a single thick or thin light emitting layer. This includes a homojunction, single heterostructure, double heterostructure, or single quantum well structure. Alternatively, the light emitting active region 135 may be a multiple quantum well light emitting region, which may include multiple quantum well light emitting layers separated by barrier layers.

The p-contact 145 may be formed on a surface of the p-type region 140. The p-contact 145 may include multiple conductive layers, such as a reflective metal and a guard metal, which may prevent or reduce electromigration of the reflective metal. The reflective metal may be silver or any other suitable material, and the guard metal may be TiW or TiWN. The n-contact 150 may be formed in contact with a surface of the n-type region 130 in an area where portions of the active region 135, the n-type region 140, and the p-contact 145 have been removed to expose at least a portion of the surface of the n-type region 130. The sidewall of the exposed mesa or via may be coated with a dielectric to prevent shorting. The contacts 145 and 150 may be, for example, metal contacts formed from metals including, but not limited to, gold, silver, nickel, aluminum, titanium, chromium, platinum, palladium, rhodium, rhenium, ruthenium, tungsten, and mixtures or alloys thereof. In other examples, one or both contacts 145 and 150 may be formed from transparent conductors, such as indium tin oxide.

The n-contact 150 and p-contact 145 are not limited to the arrangement illustrated in FIG. 1B and may be arranged in any number of different ways. In embodiments, one or more n-contact vias may be formed in the light emitting semiconductor structure 115 to make electrical contact between the n-contact 150 and the n-type layer 130. Alternatively, the n-contact 150 and p-contact 145 may be redistributed to form bond pads with a dielectric/metal stack as known in the art. The p-contact 145 and the n-contact 150 may be electrically connected to the contacts 120 and 125 of FIG. 1A, respectively, either directly or via another structure, such as a submount.

The wavelength converting material 110 may be any luminescent material, such as a phosphor, phosphor particles in a transparent or translucent binder or matrix, or a ceramic phosphor element, which absorbs light of one wavelength and emits light of a different wavelength. If the wavelength converting material 110 is a ceramic phosphor element, the ceramic phosphor element may be, for example, a ceramic phosphor plate, such as a platelet of phosphor, for generating one color of light, or a stack of ceramic phosphor platelets for generating different colors of light. The ceramic phosphor plate may have an RI of 1.4 or greater (e.g., 1.7 or greater) at the wavelengths emitted by the light emitting semiconductor structure 115.

The wavelength converting material 110 may be applied in a layer having a thickness that may depend on the wavelength converting material used or other factors related to enhancing the color point shift as a function of drive current as described in more detail below. For example, a layer of wavelength converting material 110 may be approximately 50 µm in thickness while other wavelength converting materials may be formed in layers as thin as 20 µm or as thick as 200 µm. In embodiments, the wavelength converting material 110, such as a ceramic phosphor element, may be pre-formed into a wavelength converting element and attached to the light emitting semiconductor structure 115 using an adhesive or any other method or material known in the art.

In embodiments, the light emitting semiconductor structure 115 may emit blue light. In such embodiments, the wavelength converting material 110 may include, for example, a yellow emitting wavelength converting material or green and red emitting wavelength converting materials, which will produce white light when the light emitted by the respective phosphors combines with the blue light emitted by the light emitting semiconductor structure 115. In other embodiments, the light emitting semiconductor structure 115 emits UV light. In such embodiments, the wavelength converting material 110 may include, for example, blue and yellow wavelength converting materials or blue, green and red wavelength converting materials. Wavelength converting materials emitting other colors of light may be added to tailor the spectrum of light emitted from the device 100.

In embodiments, the wavelength converting material 110 may be composed of $Y_3Al_5O_{12}:Ce^{3+}$. The wavelength converting material 110 may be an amber to red emitting rare earth metal-activated oxonitridoalumosilicate of the general formula $(Ca_{1-x-y-z}Sr_xBa_yMg_z)_{1-n}(Al_{1-a+b}Ba)Si_{1-b}N_{3-b}O_b:RE_n$ wherein $0 \leq x \leq 1$, $0 \leq y \leq 1$, $0 \leq z \leq 1$, $0 \leq a \leq 1$, $0 \leq b \leq 1$ and $0.002 \leq n \leq 0.2$, and RE may be selected from europium(II) and cerium(III). The phosphor in the ceramic phosphor plate may also be an oxido-nitrido-silicate of general formula $EA_{2-z}Si_5-aBaN_{8-a}O_a:Ln_z$, wherein $0 \leq z \leq 1$ and $0 \leq a \leq 5$, including at least one element EA selected from the group consisting of Mg, Ca, Sr, Ba and Zn and at least one element B selected from the group consisting of Al, Ga and In, and being activated by a lanthanide (Ln) selected from the group consisting of cerium, europium, terbium, praseodymium and mixtures thereof.

In other embodiments, the wavelength converting material 110 may include aluminum garnet phosphors with the general formula $(Lu_{1-x-y-a-b}Y_xGd_y)_3(Al_{1-z}Ga_z)_5O_{12}:Ce_aPr_b$, wherein $0<x<1$, $0<y<1$, $0 \leq z \leq 0.1$, $0 \leq a \leq 0.2$ and $0 \leq b \leq 0.1$, such as $Lu_3Al_5O_{12}:Ce^{3+}$ and $Y_3Al_5O_{12}:Ce^{3+}$, which emits light in the yellow-green range; and $(Sr_{1-x-y}Ba_xCa_y)_{2-z}Si_5-aAla_N_{8-a}O_a:Eu_z$ 2+, wherein $0 \leq a \leq 5$, $0 \leq x \leq 1$, $0 \leq y \leq 1$, and $0 \leq z \leq 1$ such as $Sr_2Si_5N_8:Eu^{2+}$, which emits light in the red range. Other green, yellow and red emitting phosphors may also be suitable, including $(Sr_{1-a-b}Ca_bBa_c)Si_xN_yO_z:Eu_a$ 2+; (a=0.002-0.2, b=0.0-0.25, c=0.0-0.25, x=1.5-2.5, y=1.5-2.5, z=1.5-2.5) including, $SrSi_2N_2O_2:Eu^{2+}$; $(Sr_{1-u-v-x}Mg_uCa_vBa_x)(Ga_{2-y-z}Al_yIn_zS_4):Eu^{2+}$ including, for example, $SrGa_2S_4:Eu^{2+}$; $Sr_{1-x}Ba_xSiO_4:Eu^{2+}$; and $(Ca_{1-x}Sr_x)S:Eu^{2+}$ wherein $0 \leq x \leq 1$ including, $CaS:Eu^{2+}$ and $SrS:Eu^{2+}$. Other suitable phosphors include, $CaAlSiN_3:Eu^{2+}$, $(Sr,Ca)AlSiN_3:Eu^{2+}$, and $(Sr, Ca, Mg, Ba, Zn)(Al, B, In, Ga)(Si, Ge)N_3:Eu^{2+}$.

In other embodiments, the wavelength conversion material 110 may also have a general formula $(Sr_{1-a-b}Ca_bBa_cMg_dZn_e)Si_xN_yO_z:Eu_a$ 2+, wherein $0.002 \leq a \leq 0.2$, $0.0 \leq b \leq 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 \leq z \leq 2.5$. The wavelength conversion material may also have a general formula of $M_mA_aB_bO_oN_n:Z_z$ where an element M is one or more bivalent elements, an element A is one or more trivalent elements, an element B is one or more tetravalent elements, O is oxygen that is optional and may not be in the phosphor plate, N is nitrogen, an element Z that is an activator, $n=2/3m+a+4/3b-2/3o$, wherein m, a, b can all be 1 and o can be 0 and n can be 3. M is one or more elements selected from Mg (magnesium), Ca (calcium), Sr (strontium), Ba (barium) and Zn (zinc), the element A is one or more elements selected from B (boron), Al (aluminum), In (indium) and Ga (gallium), the element B is Si (silicon) and/or Ge (germanium), and the element Z is one or more elements selected from rare earth or transition metals. The element Z is at least one or more elements selected from Eu (europium), Mg (manganese), Sm (samarium) and Ce (cerium). The element A can be Al (aluminum), the element B can be Si (silicon), and the element Z can be Eu (europium).

The wavelength conversion material 110 may also be an Eu2+ activated Sr—SiON having the formula (Sr1−a−bCab-Bac)SixNyOx:Eua, wherein a=0.002-0.2, b=0.0-0.25, c=0.0-0.25, x=1.5-2.5, y=1.5-2.5.

The wavelength conversion material 110 may also be a chemically-altered Ce: YAG (Yttrium Aluminum Garnet) phosphor that is produced by doping the Ce: YAG phosphor with the trivalent ion of praseodymium (Pr). The wavelength conversion material 110 may include a main fluorescent material and a supplemental fluorescent material. The main fluorescent material may be a Ce: YAG phosphor and the supplementary fluorescent material may be europium (Eu) activated strontium sulfide (SrS) phosphor ("Eu:SrS"). The main fluorescence material may also be a Ce: YAG phosphor or any other suitable yellow-emitting phosphor, and the supplementary fluorescent material may also be a mixed ternary crystalline material of calcium sulfide (CaS) and strontium sulfide (SrS) activated with europium ((CaxSr1_x)S:Eu2+). The main fluorescent material may also be a Ce:YAG phosphor or any other suitable yellow-emitting phosphor, and the supplementary fluorescent material may also be a nitrido-silicate doped with europium. The nitrido-silicate supplementary fluorescent material may have the chemical formula (Sr1−x−y−zBaxCay)2Si5N8:Euz 2+ where 0≤x, y≤0.5 and 0≤z≤0.1.

In embodiments, the wavelength conversion material 110 may include strontium-lithium-aluminum: europium (II) ion (SrLiAl3 N4:Eu2+) class (also referred to as SLA), including MLiAl3N4: Eu2+ (M=Sr, Ba, Ca, Mg). In a specific embodiment, the luminescent particles may be selected from the following group of luminescent material systems: MLiAl3N4:Eu (M=Sr, Ba, Ca, Mg), M2SiO4:Eu (M=Ba, Sr, Ca), MSe1−xSx:Eu (M=Sr, Ca, Mg), MSr2S4:Eu (M=Sr, Ca), M2SiF6:Mn (M=Na, K, Rb), M2TiF6:Mn (M=Na, K, Rb), MSiAlN3:Eu (M=Ca, Sr), M8Mg(SiO4)4C12:Eu (M=Ca, Sr), M3MgSi2O8:Eu (M=Sr, Ba, Ca), MSi2O2N2:Eu (M=Ba, Sr, Ca), M2Si5−xAlxOxN8−x:Eu (M=Sr, Ca, Ba). However, other systems may also be of interest and may be protected by a coating. Also combinations of particles of two or more different luminescent materials may be applied, such as e.g. a green or a yellow luminescent material in combination with a red luminescent material.

In embodiments, the wavelength conversion material 110 may be a blend of any of the above-described phosphors.

Figure 2A:
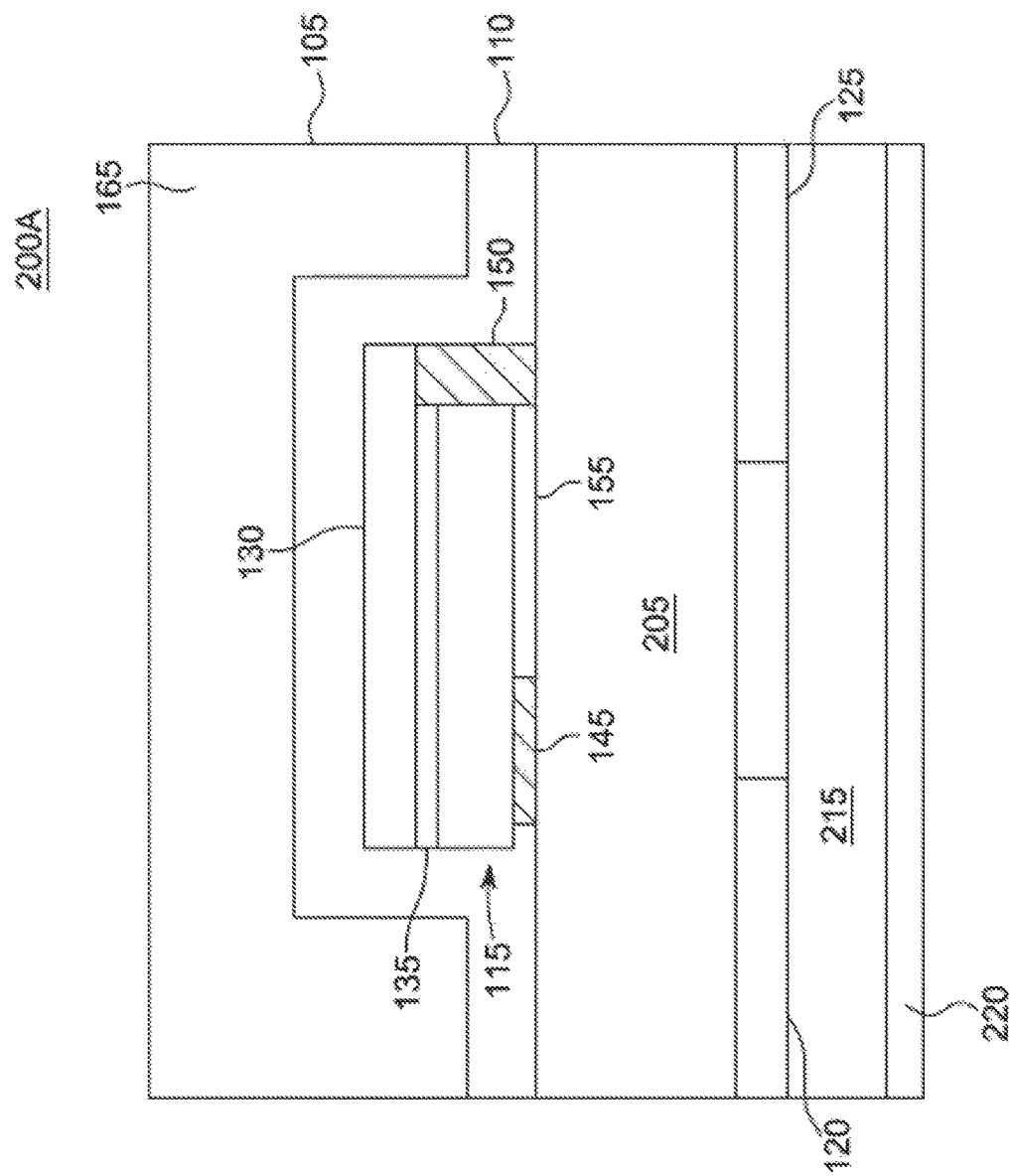
FIG. 2A is a diagram of an example light emitting device (LED) that may include the LEE of FIG. 1A.

FIG. 2A is a diagram of an example light emitting device (LED) 200A. In the example illustrated in FIG. 2A, the LED 200A includes the light emitting semiconductor structure 115 of FIG. 1B, which is mounted to a submount 205 that includes the contacts 120 and 125. The light emitting semiconductor structure 115 may be mounted to the submount 205 by an electrical coupling between the contacts 145 and 150 on the light emitting semiconductor structure 115 and submount electrodes on an adjacent surface of the submount 205 (not shown in FIG. 2A). The submount electrodes may be electrically connected by vias (not shown) to the contacts 120 and 125 on the opposite surface of the submount 205. In embodiments, the LED 200A may be mounted to a printed circuit board (PCB) 215. In such embodiments, the submount 205 may be mounted via the contacts 120 and 125 to the PCB 215. Metal traces on the circuit board may electrically couple the contacts 120 and 125 to a power supply, such that an operational or drive voltage and current may be applied to the LED when it is desired to turn the LED on.

The submount 205 may be formed from any suitable material, such as ceramic, Si, or aluminum. If the submount material is conductive, an insulating material may be disposed over the substrate material, and the metal electrode pattern may be formed over the insulating material. The submount 205 may act as a mechanical support, provide an electrical interface between the n and p electrodes on the LED chip and a power supply, and provide heat sinking. In embodiments, a heat sink may alternatively or additionally be provided on the PCB 215, such as a metal core PCB-MCPCB heat sink 220 illustrated in FIG. 2A. While the heat sink 220 is illustrated in FIG. 2A as being attached to the bottom of the PCB 215, one of ordinary skill in the art will recognize that other arrangements are possible without departing from the scope of the embodiments described herein.

In the example LED 200A, the wavelength converting material 110 completely surrounds the light emitting semiconductor structure 115 on all surfaces except the surface that electrically connects the light emitting semiconductor structure 115 to the submount 205. The optional coating 105 may be disposed in direct contact with the wavelength converting material 110. The coating may not be a separate layer, may be a coating on the individual phosphor particles or may be formed on the ceramic phosphor, and this coating may include pores. These pores may be filled with a binder or matrix material and may be part of the wavelength converter 110. Coatings of phosphor materials are described in U.S. patent application Ser. No. 15/802,273, which was filed on Nov. 2, 2017 and is incorporated by reference herein in its entirety. Phosphor coatings of sol-gel, atomic layer deposition (ALD), evaporation, sputtering, dip and dry, or spin coating methods include SiO2, Al2O3, HfO2, Ta2O5, ZrO2, TiO2, Y2O$_3$, and Nb2O5. Coatings may be thick enough to include pores that may be formed during or after deposition.

Figure 2B:
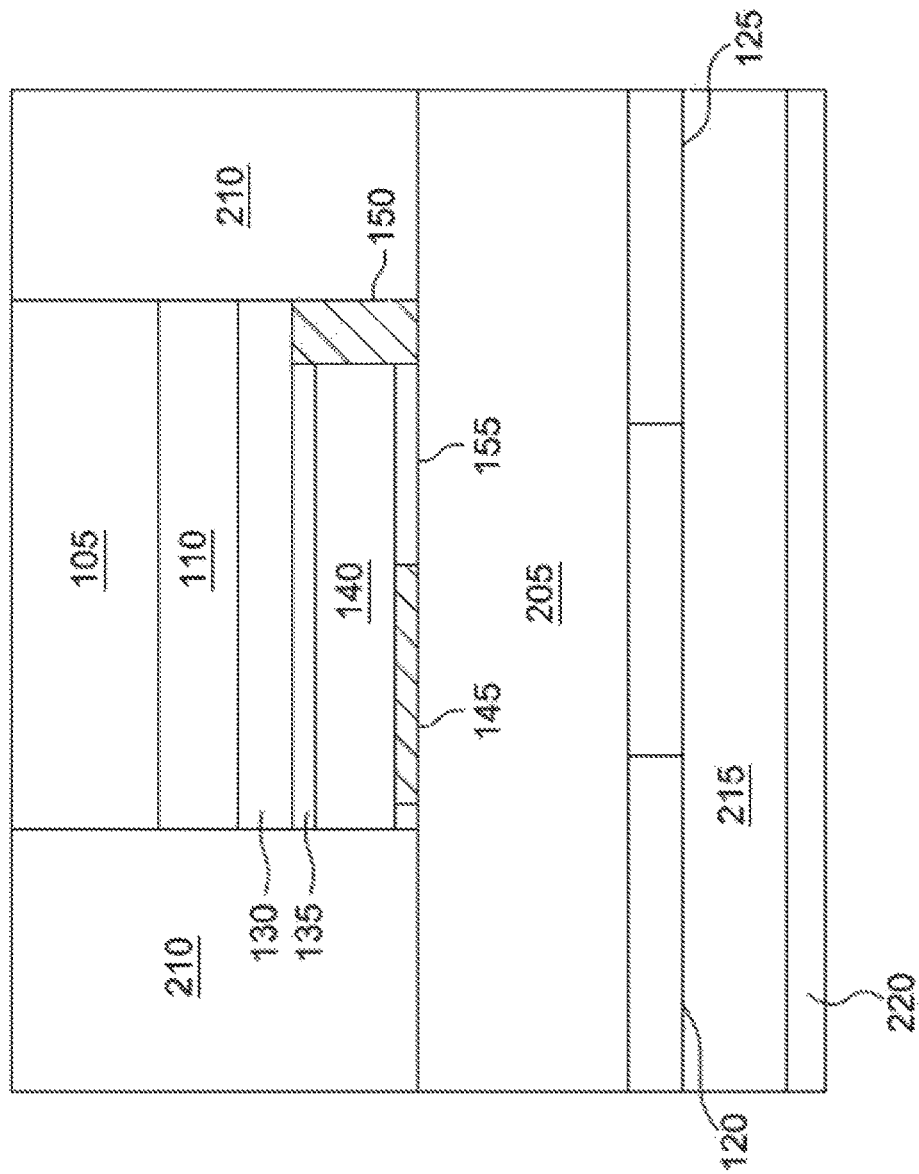
FIG. 2B is a diagram of another example LED that may include the LEE of FIG. 1A.

FIG. 2B is a diagram of another example LED 200B. In the example LED 200B, the wavelength converting material 110 is deposited on the light emitting semiconductor structure 115. The optional coating 105 may be disposed in direct contact with the wavelength converting material 110. A structure 210, such as a frame, is disposed adjacent side surfaces of a stack formed by the light emitting semiconductor structure 115, the wavelength converting material 110 and the optional coating 105 and may surround the stack. The entire structure 210, but at least inner surfaces of the structure 210 that are adjacent the stack, may be formed from or coated in a light reflecting material, such as an interference layer or a strongly scattering layer, to further minimize absorption of any scattered light.

According to implementations of the disclosed subject matter, the wavelength converting material 110 may include transparent particles. The transparent particles may be any applicable transparent particles based on the disclosure herein and may be silica, glass, fluorides such as calcium fluoride, sulfates, plastics, or the like. Transparent particles may cause the volume of the wavelength converting material to be greater than the volume of the wavelength converting material without the transparent particles. Notably, the transparent particles may cause the volume of the wavelength converting material to be large enough such that the wavelength converting material, when deposited on a semiconductor device die, covers the side surfaces of the die.

Figure 3A:
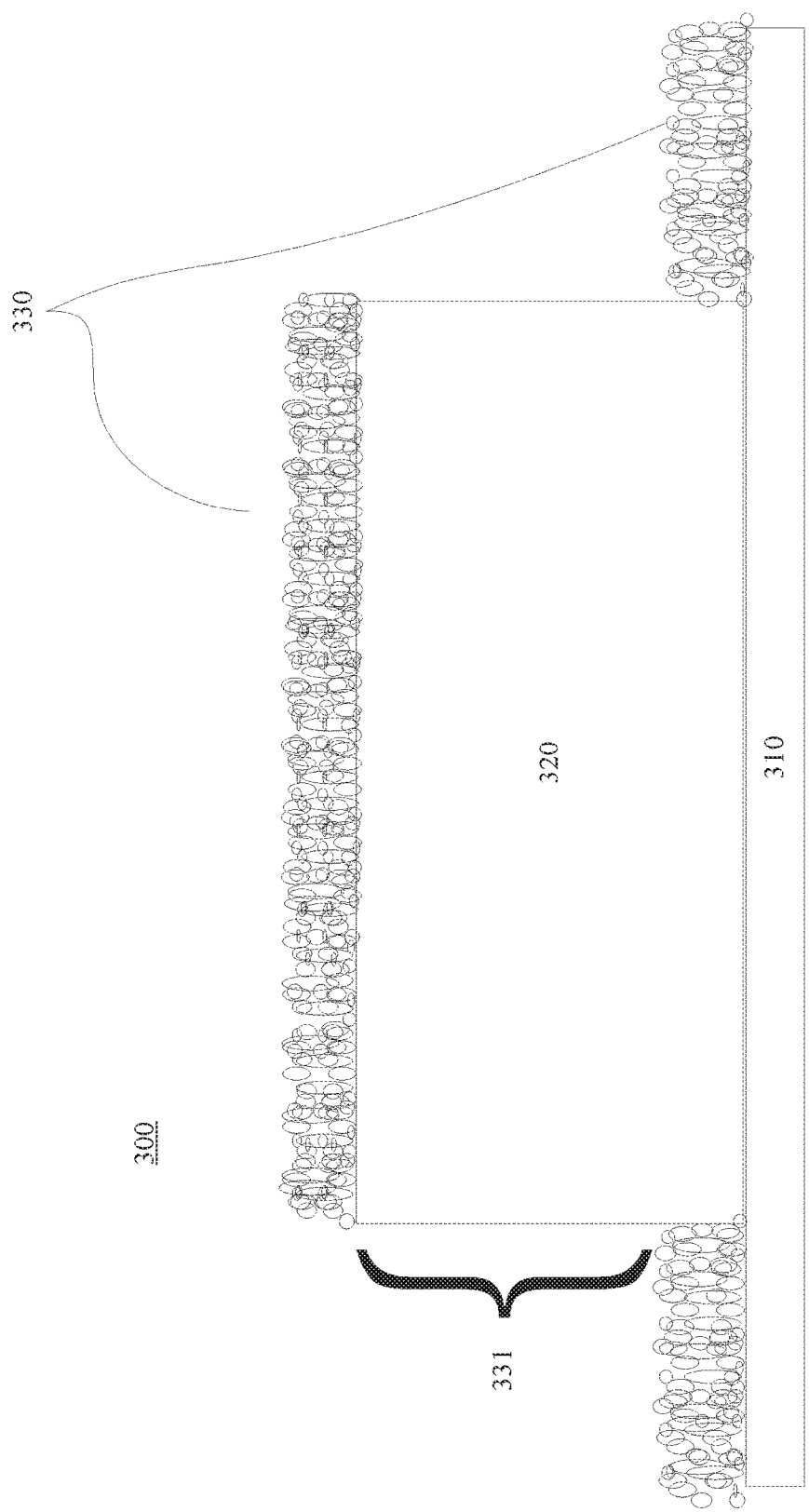
FIG. 3A is a diagram of an example of an LED with a wavelength converting material without silica.

FIG. 3A shows an example semiconductor LED 300 with a substrate 310 and LED die 320. The LED die 320 may be a semiconductor device made any applicable material such as, but not limited to III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof. When electric current passes through the die, it may emit a light such as, for example, a blue light. One or more die may be mounted to a substrate 310 which may be made of aluminum, ceramic, other applicable materials or combinations thereof. The die 320 may be a tall die such that its height may be greater than or equal to 100 or 150 micro meters. According to an implementation, the die 320 may be a tall die such that its height may be greater than or equal to 200 micro meters. According to an implementation, the die 320 may be a tall die such that its height may be greater than or equal to 250 micro meters. FIG. 3A shows a wavelength converting material 330 which does not include transparent particles, as further disclosed herein. As shown, the wavelength converting material 330 may be deposited on the top of the die 320 to cover the top surface of the die. The wavelength converting material 330 may be deposited on the sides of the die 320 such that it only covers a portion of the side surfaces of the die 320. Specifically, as shown, the wavelength converting material 330 may cover only a portion of the side surfaces of the die 320 such that a portion 331 of the die is exposed.

The wavelength converting material 330 may include wavelength converting elements and a carrier to hold the wavelength converting materials together. The carrier may be a transparent risen carrier such as a silicone carrier. Additionally, a stabilizing agent may be used to maintain a homogeneous distribution. The use of such a stabilizing agent may enable the wavelength converting material to be more thixotropic.

At least a portion of the light emitted from the die 320 may exit the die without passing through wavelength converting material 330. Specifically, a portion of the light emitted from the die 320 may exit through the portion 331 such that it does not pass through the wavelength converting material 330. As a result, as disclosed herein, the COA for the light emitted by the semiconductor LED 300 may be undesirably high.

It will be noted that the wavelength converting material 330, as shown in FIG. 3A may be settled as a result of sedimentation. Sedimentation may result in thermal improvements and, thus, may be a process which benefits the overall performance of the semiconductor LED 300.

Figure 4A:
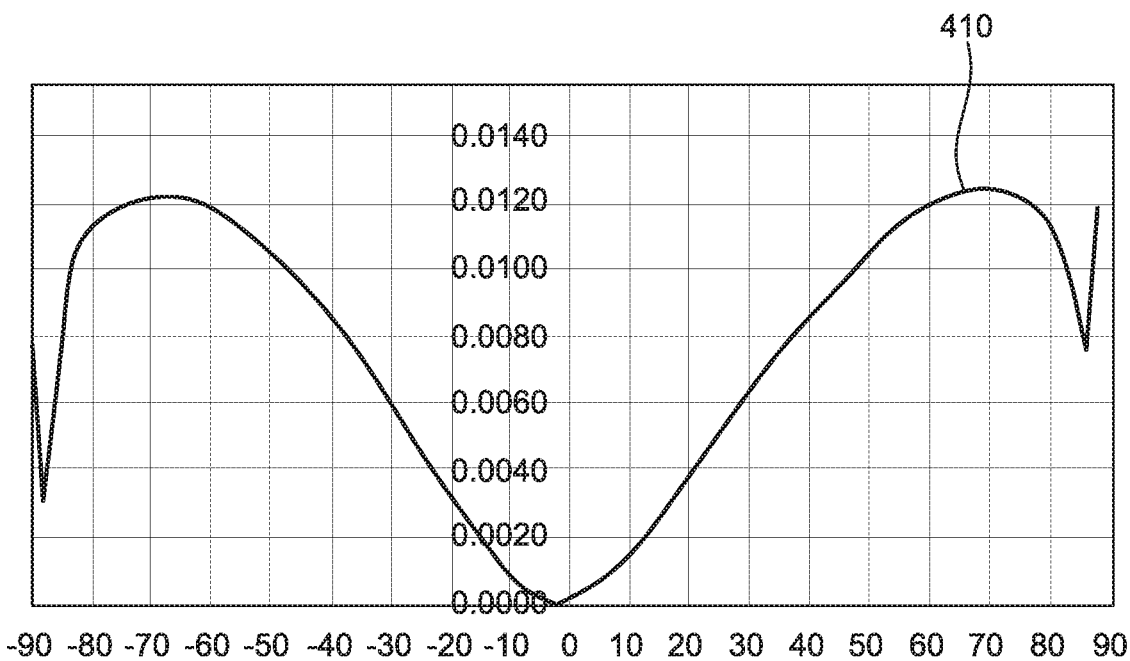
FIG. 4A is a graph representing a color over angle corresponding to FIG. 3A.

FIG. 4A shows a graph 400 which shows the COA 410 of the LED device of FIG. 3A. The horizontal axis corresponds to the angle of view from the LED device such that 0 corresponds to a perpendicular view of the LED device and 90/−90 correspond to a parallel view of the LED device. The vertical axis corresponds to a color value deviation du'v' where a color value deviation of 0, viewed from a perpendicular position that is directly above the LED device 300 of FIG. 3A may be an ideal color value. As shown, the COA deviates from 0 to approximately 0.012 (or 12 points), as shown in FIG. 4A for the device 300 of FIG. 3A. A deviation of 0.012 (or 12 points) may be considered a large deviation and may not be desirable. According to an implementation a du'v' of 0.08 (or 8 points) may be preferred.

Figure 3B:
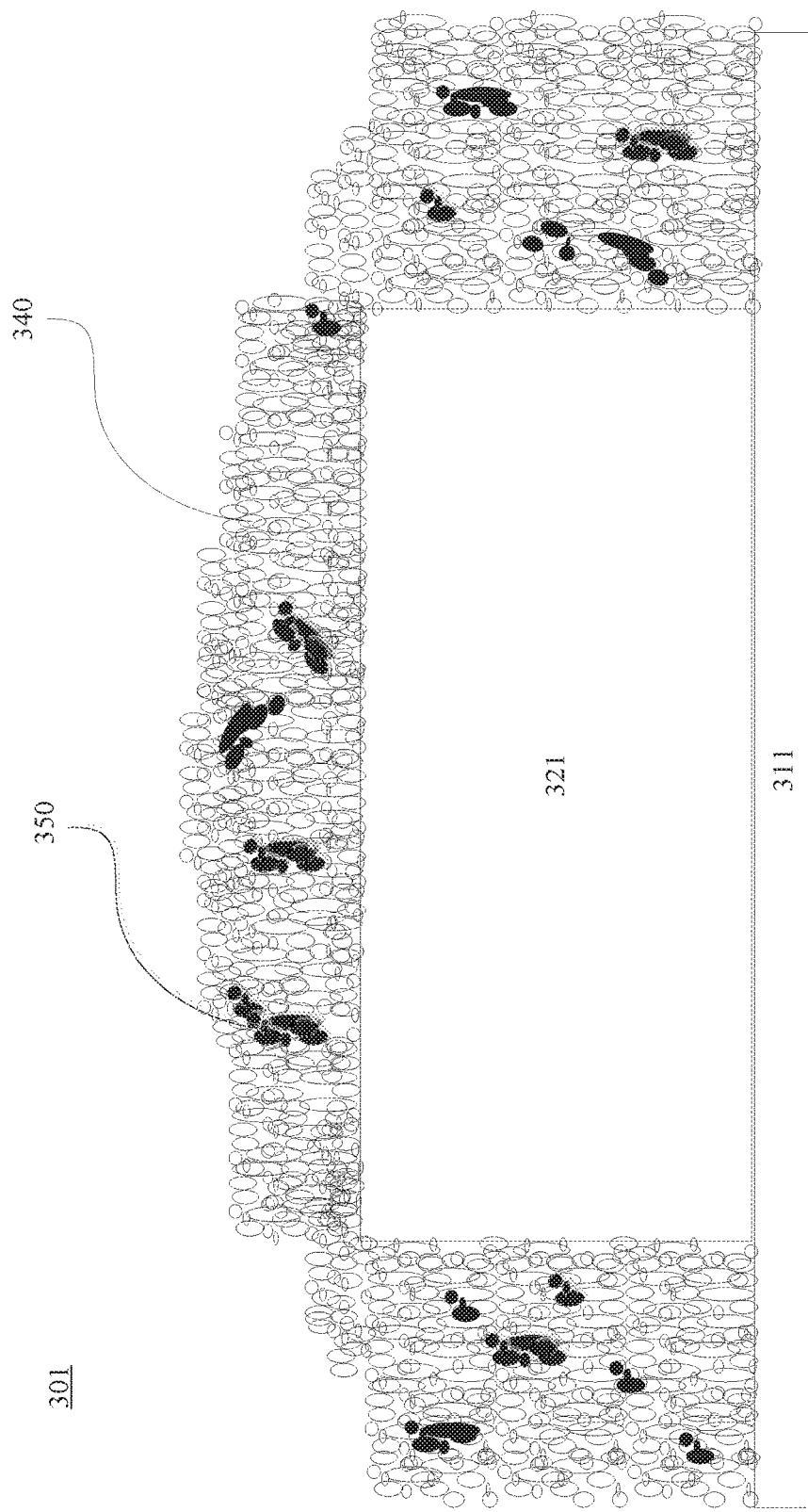
FIG. 3B is a diagram of an example of an LED with a wavelength converting material with silica.

FIG. 3B shows an example semiconductor LED 301 with substrate 311 and LED die 321. The LED die 321 may be a semiconductor device made any applicable material such as, but not limited to III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof. When electric current passes through the die, it may emit a light such as, for example, a blue light. One or more die may be mounted to a substrate 311 which may be made of aluminum or ceramic or combinations thereof. The die 321 may be a tall die such that its height may be greater than or equal to 100 or 150 micro meters. According to an implementation, the die 321 may be a tall die such that its height may be greater than or equal to 200 micro meters. According to an implementation, the die 321 may be a tall die such that its height may be greater than or equal to 250 micro meters.

FIG. 3B shows a wavelength converting material 340 including silica 350. The wavelength converting material 340 may be similar to the wavelength converting material 330 of FIG. 3A but without the silica 350. As shown in FIG. 3B, the silica 350 may increase the volume of the wavelength converting material 340 such that the wavelength converting material 340 covers the side walls of the die 321. As a result, all or substantially all of the light emitted by the die 321 may pass through the wavelength converting material 340 with silica 350. The COA of the light emitted from by the die 321 may be lower than that of the light emitted by the die 320 of FIG. 3A as a result of all or substantially all of the light emitted by the die 321 passing through the wavelength converting material 340 with silica 350. According to an implementation, the silica 350 may increase the volume of the wavelength converting material 340.

The wavelength converting material 340 may include wavelength converting elements and a carrier to hold the wavelength converting materials together. The carrier may be a transparent risen carrier such as a silicone carrier. Additionally, a stabilizing agent may be used to maintain a homogeneous distribution. The use of such a stabilizing agent may enable the wavelength converting material to be more thixotropic.

Figure 4B:
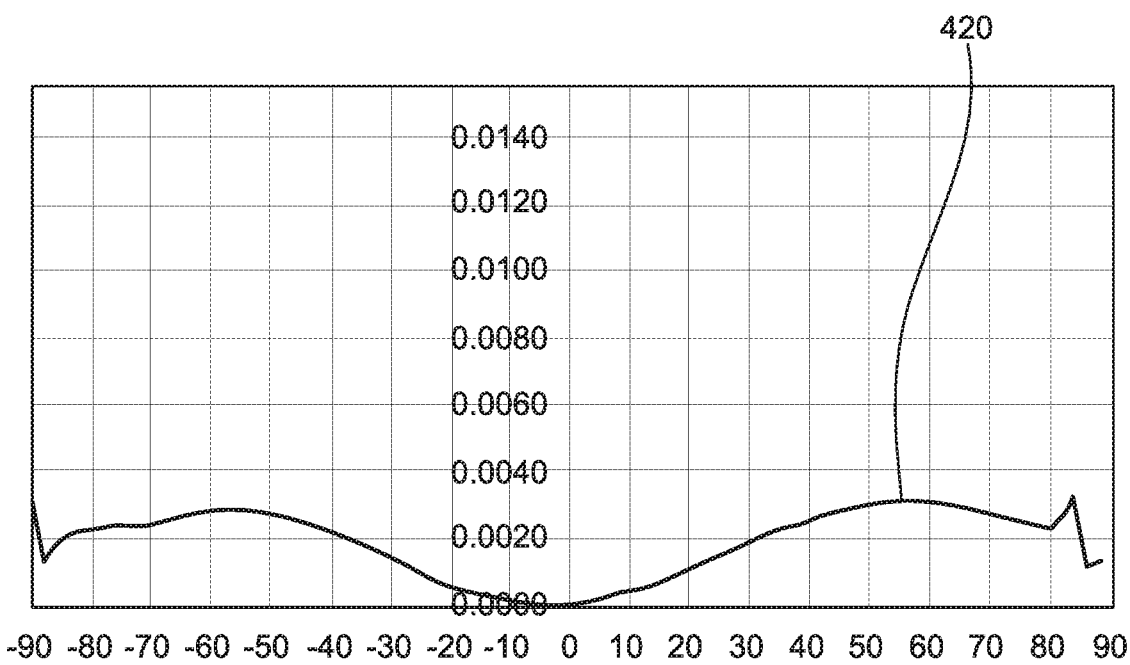
FIG. 4B is a graph representing a color over angle corresponding to FIG. 3B.

FIG. 4B shows a graph 401 which shows the COA 420 of the LED device of FIG. 3B. The horizontal axis corresponds to the angle of view from the LED device such that 0 corresponds to a perpendicular view of the LED device and 90/−90 correspond to a parallel view of the LED device. The vertical axis corresponds to a color value deviation where a color value deviation of 0, viewed from a perpendicular position that is directly above the LED device 301 of FIG. 3B may be an ideal color value. As shown, the COA deviates from 0 to approximately 0.003, as shown in FIG. 4B for the device 301 of FIG. 3B. A deviation of 0.003 may be considered an acceptable deviation. As a comparison, FIG. 4A, as described herein, shows the COA 410 of device 300 of FIG. 3A where the wavelength converting material 330 does not cover the sides of the die 320. As a result, the color deviation of up to 0.012, as shown in FIG. 4A, is experienced for the device 300 of FIG. 3A.

It should be noted that the volume of the wavelength converting material 340 with silica 350 may allow the sides of the die 321 to be covered even after a sedimentation process. Accordingly, by using the silica 350 with the wavelength converting material 340 to cover the die 321, including after a sedimentation process, both reduction of COA as well as the thermal improvements as a result of the sedimentation may be obtained. According to an implementation, at least 50% of a side of a die may be covered by wavelength converting material with transparent particles, as disclosed herein, after the sedimentation process.

Further, it should be noted that simply increasing the amount of wavelength converting material used in order to cover the sides of a semiconductor's die may not be a viable option as such an increase may prohibitively increase the cost of manufacturing. Additionally, increasing the amount of wavelength converting material may also change the color point of the wavelength converting material, which may not be desirable.

The transparent particles, such as the silica 350 of FIG. 3B, may be fused quartz or fused silica and may be glass consisting of silica in amorphous (non-crystalline) form. The silica may be manufactured, configured or otherwise have properties such that the optical properties of a die and/or wavelength converting material are not altered.

The transparent particles may be transparent such that no or minimal absorption of light occurs at the transparent particles. The particle size of the transparent particles may be similar to the particle size of the wavelength converting material. For example, if the wavelength converting material includes phosphor, then the phosphor particle size may be similar to the transparent particle size. Such particles may range from 5 micro meters to 50 micro meters. Additionally, the transparent particles may have properties such that the transparent particles do not affect silicone curing.

Notably, the transparent particles may have a refractive index (RI) that is substantially similar to the RI of the transparent risen carrier in the wavelength converting material. The RI indicates the amount that a light, which passes through a material, bends. The transparent particles having an RI that is substantially similar to the RI of the transparent risen carrier (e.g., a silicone carrier) of the wavelength converting material may allow a light to propagate a wavelength converting material with transparent particles as it would propagate the wavelength converting material if without transparent particles. According to an implementation, the RI of the transparent particles may be within 5% of the RI of a wavelength converting material transparent risen carrier. According to another implementation, the RI of the transparent particles may be within 2% of the RI of the wavelength converting material transparent risen carrier.

According to implementations disclosed herein, the semiconductor LED devices, such as the semiconductor LED devices 300 and 301 of FIGS. 3A and 3B, respectively, may be chip on board (COB) devices. COB devices may be bonded directly to a substrate to form a single module. Such devices may use a single circuit and multiple devices may share electrical contacts.

According to implementations disclosed herein, the semiconductor LED devices, such as the semiconductor LED devices 300 and 301 of FIGS. 3A and 3B, respectively, may be part of a wafer which contains multiple devices and which may be singulated to produce individual dies.

Figure 5:
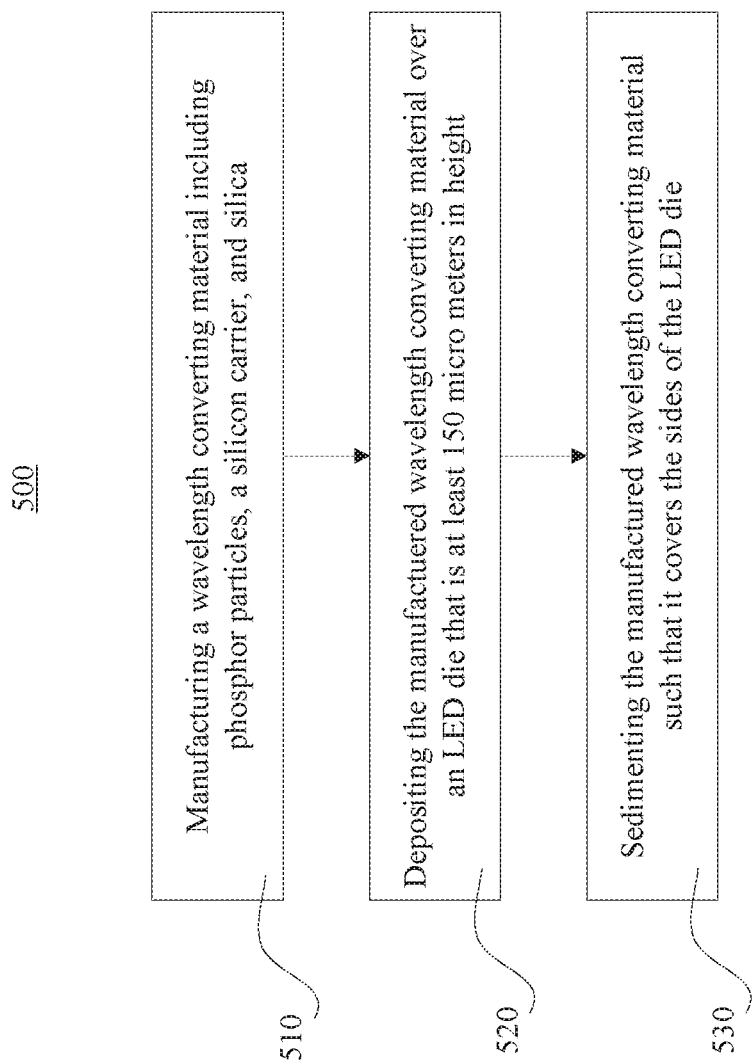
FIG. 5 is a flowchart outlining a process to obtain a color over angle of FIG. 4B via silica in a wavelength converting material.

Flowchart 500 of FIG. 5 shows a technique for manufacturing or producing an LED die based on the techniques disclosed herein. As shown at step 510, a wavelength converting material may be manufactured and may include phosphor particles, a silicon carrier, and transparent particles as disclosed herein. The transparent particles may be configured to increase the volume of the wavelength converting material and may have a refractive index (RI) that is similar to the RI of the transparent risen carrier.

At step 520 of FIG. 5, the manufactured wavelength converting material may be deposited over an LED die that is at least 100 micro meters in height. The wavelength converting material may cover the side surfaces of the LED die. At step 530, the wavelength converting material may sediment. The wavelength converting material may cover the side surfaces of the LED even after the sedemntation.

The figures provided herein are provided as an example only. At least some of the elements discussed with respect to these figures can be arranged in different order, combined, and/or altogether omitted. It will be understood that the provision of the examples described herein, as well as clauses phrased as "such as," "e.g.", "including", "in some aspects," "in some implementations," and the like should not be interpreted as limiting the disclosed subject matter to the specific examples.

Having described the invention in detail, those skilled in the art will appreciate that, given the present disclosure, modifications may be made to the invention without departing from the spirit of the inventive concepts described herein. Therefore, it is not intended that the scope of the invention be limited to the specific embodiments illustrated and described.

What is being claimed is:

1. A light emitting device comprising:
a semiconductor light emitting diode die comprising a light emitting first surface and a second surface located opposite from the first surface at a distance of at least 100 microns from the first surface, and light emitting side surfaces connecting the light emitting first surface and the second surface; and
a wavelength converting material disposed on the light emitting first surface and the light emitting side surfaces of the semiconductor light emitting diode die, the wavelength converting material comprising phosphor particles and transparent particles dispersed in a transparent resin material, the transparent particles having a refractive index approximately matching a refractive index of the transparent resin material, the wavelength converting material comprising a first portion disposed on the light emitting first surface and having a first maximum height relative to the second surface, and a second portion disposed adjacent to and covering at least 50% of respective sidewalls of the semiconductor light emitting diode die and having a second maximum height relative to the second surface lower than the first maximum height, and phosphor particles in the wavelength converting material distributed uniformly on the respective sidewalls of the semiconductor light emitting diode die from the second surface to at least 50% of the distance between the second surface and the first surface.

2. The light emitting device of claim 1, wherein phosphor particles in the wavelength converting material are distributed uniformly along the sides of the die from the second surface to at least 75% of the distance between the second surface and the first surface.

3. The light emitting device of claim 2, wherein phosphor particles in the wavelength converting material are distributed uniformly along the sides of the die along the full length of the distance between the second surface and the first surface.

4. The light emitting device of claim 1, wherein the refractive index of the transparent particles and the refractive index of the transparent resin material differ by 5% or less.

5. The light emitting device of claim 4, wherein the refractive index of the transparent particles and the refractive index of the transparent resin material differ by 2% or less.

6. The light emitting device of claim 1, wherein the wavelength converting material comprises a stabilizer promoting a homogenous distribution of the phosphor particles and transparent particles in the transparent resin material.

7. The device of claim 1, wherein a color over angle (COA) variation is less than 8 points du'v'.

8. The light emitting device of claim 1, wherein the second surface is located at least 150 microns from the first surface.

9. The light emitting device of claim 1, wherein the second surface is located at least 200 microns from the first surface.

10. The light emitting device of claim 1, wherein the second surface is located at least 250 microns from the first surface.

11. The light emitting device of claim 1, wherein the transparent particles are fused quartz.

12. The light emitting device of claim 1, wherein the transparent particles are fused silica.

13. The light emitting device of claim 1, wherein the transparent particles are glass consisting of silica in non-crystalline form.

14. The light emitting device of claim 1, wherein the transparent particles are fluorides.

15. The light emitting device of claim 1, wherein the transparent particles are sulfates.

16. The light emitting device of claim 1, wherein the second surface is located greater than 250 microns from the first surface.

17. The light emitting device of claim 1, wherein the transparent particles are a similar size to the phosphor particle size.

18. The light emitting device of claim 1, wherein the transparent particles have a size from 5 microns to 50 microns.

19. The light emitting device of claim 1, wherein the transparent particles increase the height of the wavelength converting material in a first direction perpendicular to the first surface.

20. The light emitting device of claim 1, wherein the second maximum height of the second portion of the wavelength converting material is lower than a first lowest height of the first portion of the wavelength converting material, the first lowest height being relative to the second surface.

* * * * *